US008623702B2

(12) United States Patent
Pagaila

(10) Patent No.: US 8,623,702 B2
(45) Date of Patent: Jan. 7, 2014

(54) SEMICONDUCTOR DEVICE AND METHOD OF FORMING CONDUCTIVE THV AND RDL ON OPPOSITE SIDES OF SEMICONDUCTOR DIE FOR RDL-TO-RDL BONDING

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 55 days.

(21) Appl. No.: 13/034,133

(22) Filed: Feb. 24, 2011

(65) Prior Publication Data

US 2012/0217644 A1 Aug. 30, 2012

(51) Int. Cl.
*H01L 21/00* (2006.01)

(52) U.S. Cl.
USPC .......................... 438/112; 438/107; 438/127

(58) Field of Classification Search
USPC .......... 438/106, 109–112, 107, 127; 257/774, 257/E21.705, E23.011, E25.018
See application file for complete search history.

(56) References Cited

U.S. PATENT DOCUMENTS

| 7,829,998 | B2 | 11/2010 | Do et al. | |
|---|---|---|---|---|
| 8,080,445 | B1 * | 12/2011 | Pagaila | 438/106 |
| 2003/0209806 | A1 * | 11/2003 | Akagawa | 257/758 |
| 2007/0158807 | A1 * | 7/2007 | Lu et al. | 257/686 |
| 2009/0008793 | A1 | 1/2009 | Pohl et al. | |
| 2009/0230565 | A1 | 9/2009 | Yang et al. | |
| 2009/0283870 | A1 | 11/2009 | Pagaila et al. | |
| 2009/0302445 | A1 * | 12/2009 | Pagaila et al. | 257/678 |
| 2009/0302478 | A1 * | 12/2009 | Pagaila et al. | 257/774 |

* cited by examiner

*Primary Examiner* — Walter H Swanson
*Assistant Examiner* — Wilner Jean Baptiste
(74) *Attorney, Agent, or Firm* — Robert D. Atkins; Patent Law Group: Atkins & Associates, P.C.

(57) ABSTRACT

A semiconductor device has a plurality of semiconductor die mounted to a carrier. An encapsulant is deposited over the carrier around a peripheral region of the semiconductor die. A plurality of vias is formed through the encapsulant. A first conductive layer is conformally applied over a sidewall of the vias to form conductive vias. A second conductive layer is formed over a first surface of the semiconductor die between the conductive vias and contact pads of the semiconductor die. The first and second conductive layers can be formed during the same manufacturing process. A third conductive layer is formed over a second surface of the semiconductor die opposite the first surface of the semiconductor die. The third conductive layer is electrically connected to the conductive vias. A plurality of semiconductor die is stacked and electrically connected through the conductive vias and second and third conductive layers.

25 Claims, 10 Drawing Sheets

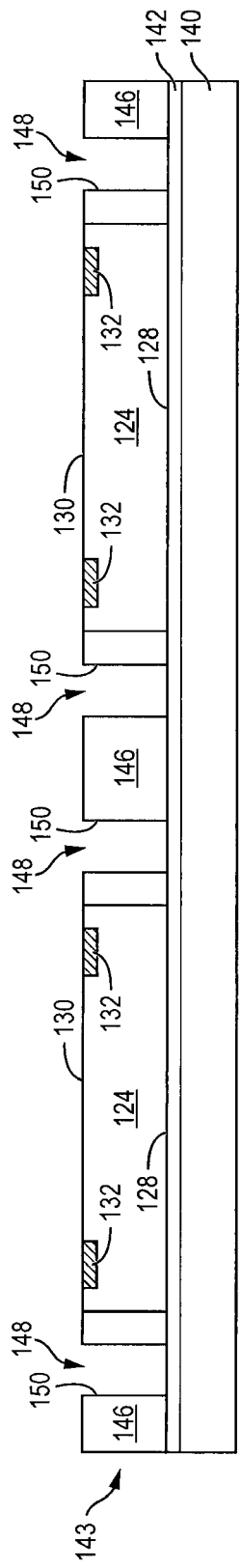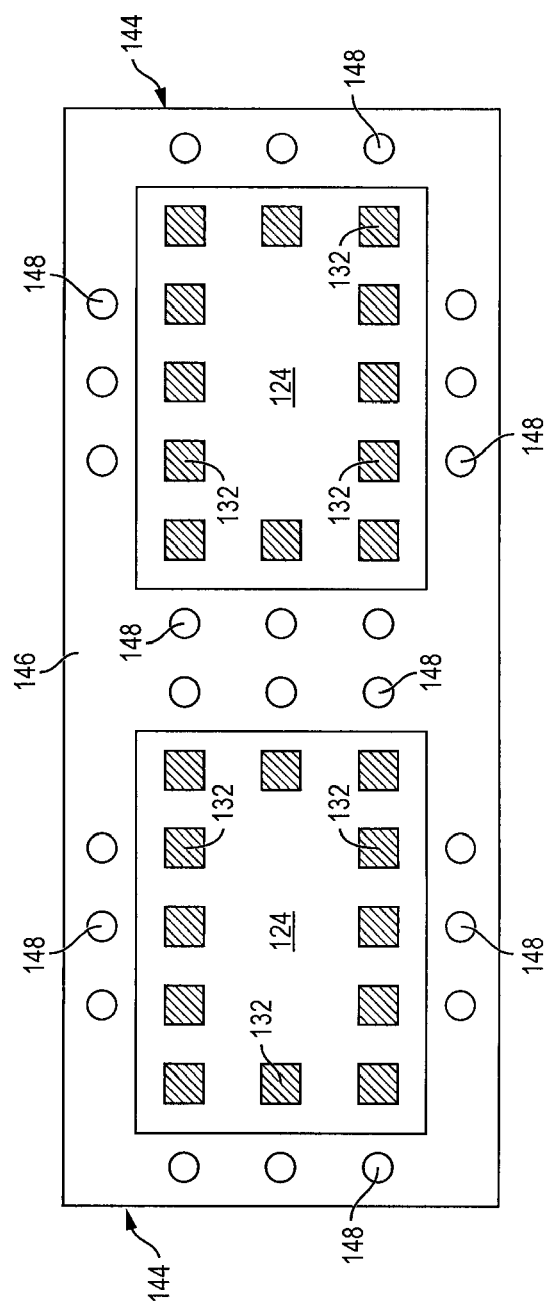

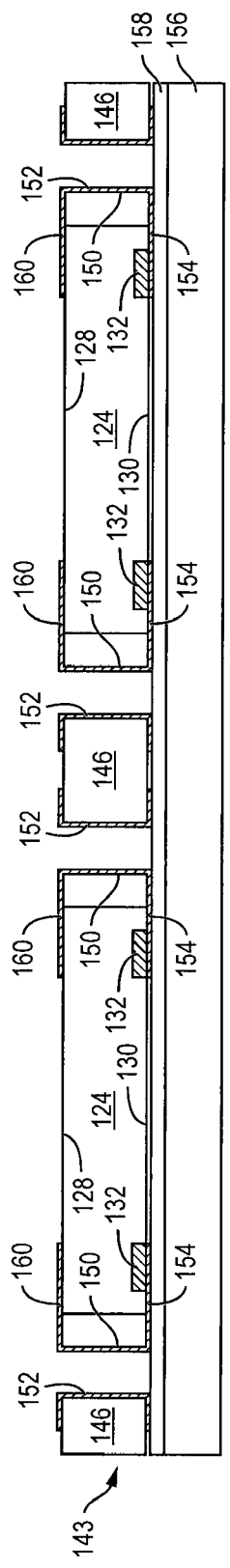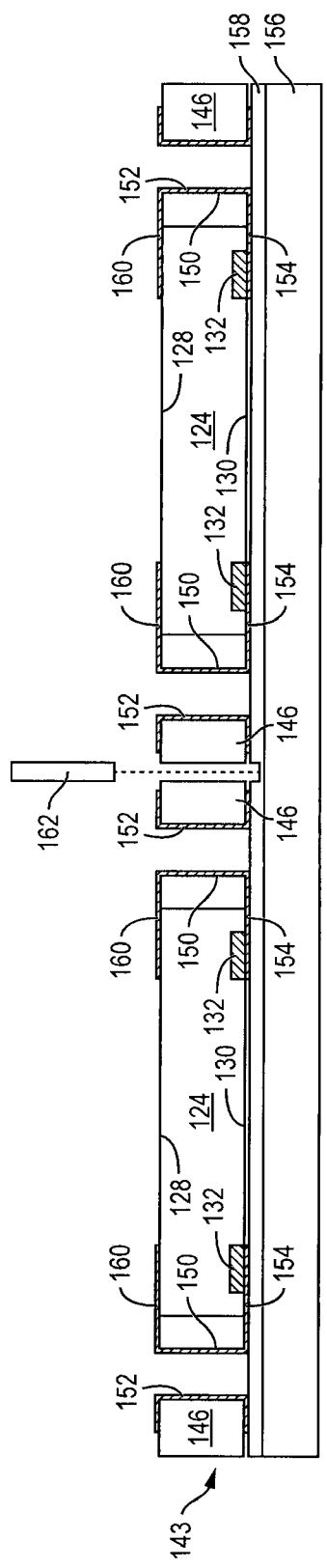

US 8,623,702 B2

SEMICONDUCTOR DEVICE AND METHOD OF FORMING CONDUCTIVE THV AND RDL ON OPPOSITE SIDES OF SEMICONDUCTOR DIE FOR RDL-TO-RDL BONDING

FIELD OF THE INVENTION

The present invention relates in general to semiconductor devices and, more particularly, to a semiconductor device and method of forming conductive THVs and RDLs on opposite sides of a semiconductor die for RDL-to-RDL bonding.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor die are commonly stacked or otherwise require vertical z-direction interconnect capability. The vertical interconnect can be achieved with conductive through hole vias (THV) or conductive through silicon vias (TSV). The THVs and TSVs are formed by completely filling vias with electrically conductive material. The process of filling the vias with electrically conductive material is time consuming, costly, and can cause voids, particularly for high aspect ratio vias. The conductive vias are electrically connected to contact pads on the semiconductor die with redistribution layers (RDL). When stacking semiconductor die, the THV of the upper die is electrically connected to the THV of the lower die with bumps. The bumps are typically dissimilar material to the THV, which can increase electrical interconnect resistance. The contact area between the THV and bumps is relatively small, leaving the interconnect prone to breakage. The voids and interconnect bumps lead to defects and reduced reliability.

SUMMARY OF THE INVENTION

A need exists to electrically interconnect semiconductor die in a cost effective and efficient manner. Accordingly, in one embodiment, the present invention is a method of making a semiconductor device comprising the steps of providing a carrier, mounting a plurality of semiconductor die to the carrier, depositing an encapsulant over the carrier around a peripheral region of the semiconductor die, forming a plurality of vias through the encapsulant, conformally applying a first conductive layer over a sidewall of the vias to form conductive vias, forming a second conductive layer over a first surface of the semiconductor die between the conductive vias and contact pads of the semiconductor die, forming a third conductive layer over a second surface of the semiconductor die opposite the first surface of the semiconductor die, and singulating the semiconductor die from the carrier. The third conductive layer is electrically connected to the conductive vias.

In another embodiment, the present invention is a method of making a semiconductor device comprising the steps of providing a plurality of semiconductor die with a peripheral region around the semiconductor die, depositing an encapsulant around the peripheral region of the semiconductor die, forming a plurality of vias through the encapsulant, conformally applying a first conductive layer over a sidewall of the vias to form conductive vias, forming a second conductive layer over a first surface of the semiconductor die between the conductive vias and contact pads of the semiconductor die, and forming a third conductive layer over a second surface of the semiconductor die opposite the first surface of the semiconductor die. The third conductive layer is electrically connected to the conductive vias.

In another embodiment, the present invention is a method of making a semiconductor device comprising the steps of depositing an encapsulant around a peripheral region of a semiconductor die, forming a conductive via through the encapsulant, forming a first conductive layer over a first surface of the semiconductor die between the conductive via and a contact pad of the semiconductor die, and forming a second conductive layer over a second surface of the semiconductor die opposite the first surface of the semiconductor die. The second conductive layer is electrically connected to the conductive via.

In another embodiment, the present invention is a semiconductor device comprising a semiconductor die having a peripheral region around the semiconductor die. An encapsulant is deposited around the peripheral region of the semiconductor die. A plurality of conductive vias is formed through the encapsulant. A first conductive layer is disposed over a first surface of the semiconductor die between the conductive vias and contact pads of the semiconductor die. A second conductive layer is disposed over a second surface of the semiconductor die opposite the first surface of the semiconductor die. The third conductive layer is electrically connected to the conductive vias.

BRIEF DESCRIPTION OF THE DRAWINGS

FIGS. 4a-4i illustrate a process of forming conductive THVs and RDLs on opposite sides of a semiconductor die for RDL-to-RDL bonding;

DETAILED DESCRIPTION OF THE DRAWINGS

Figure 1:
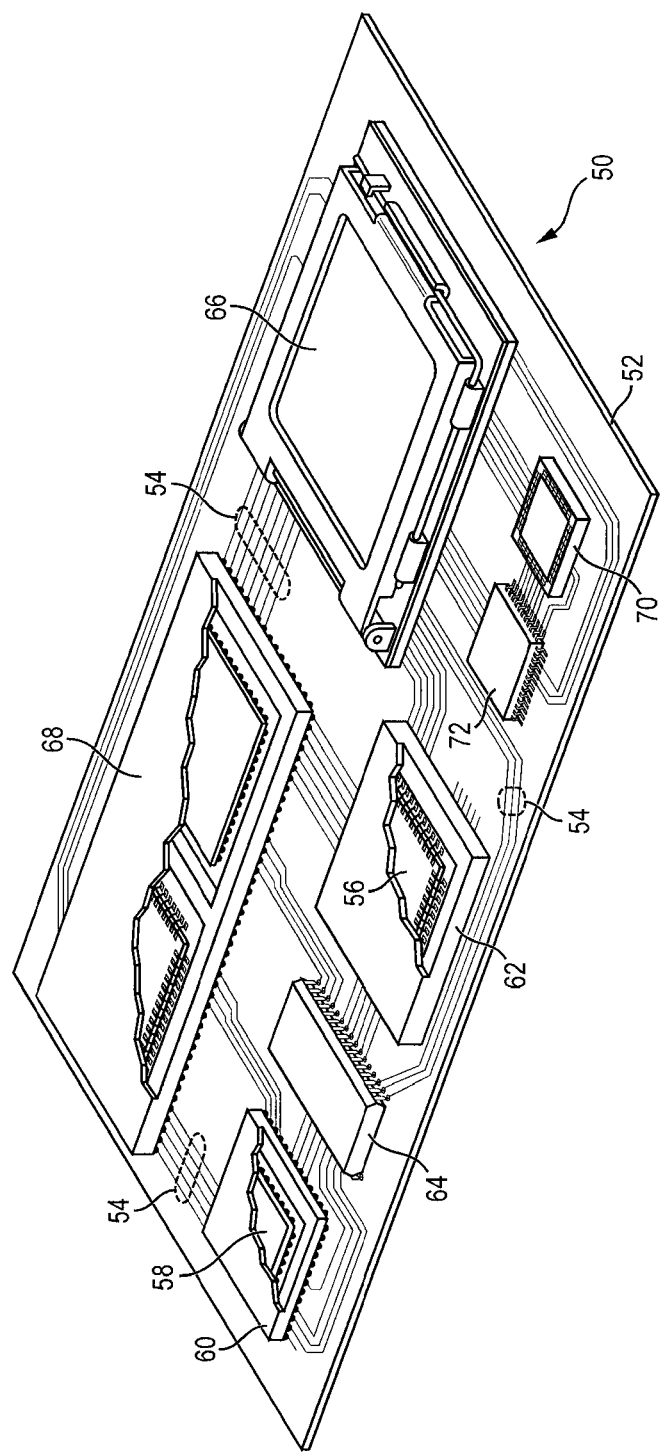
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
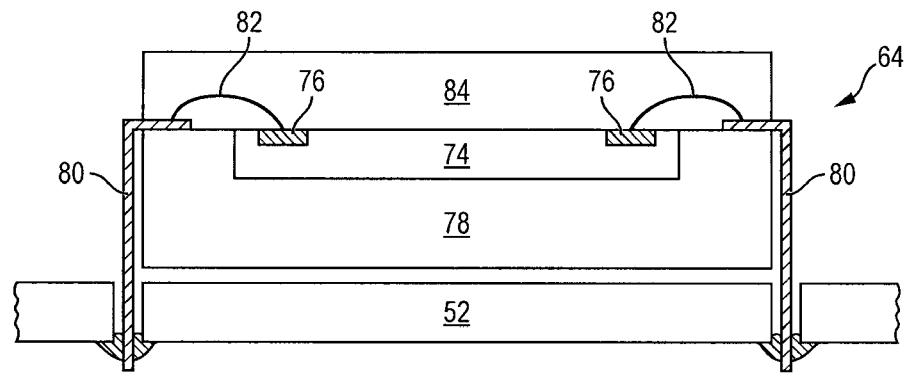
FIGS. 2a-2c illustrate further detail of the representative semiconductor packages mounted to the PCB.
Figure 2B:
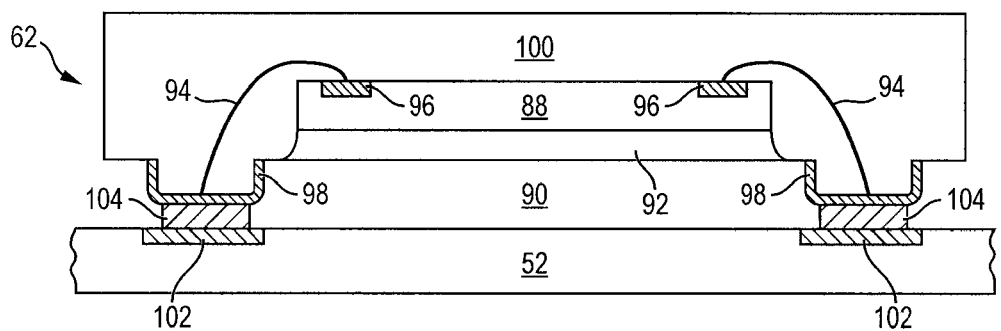
Figure 2C:
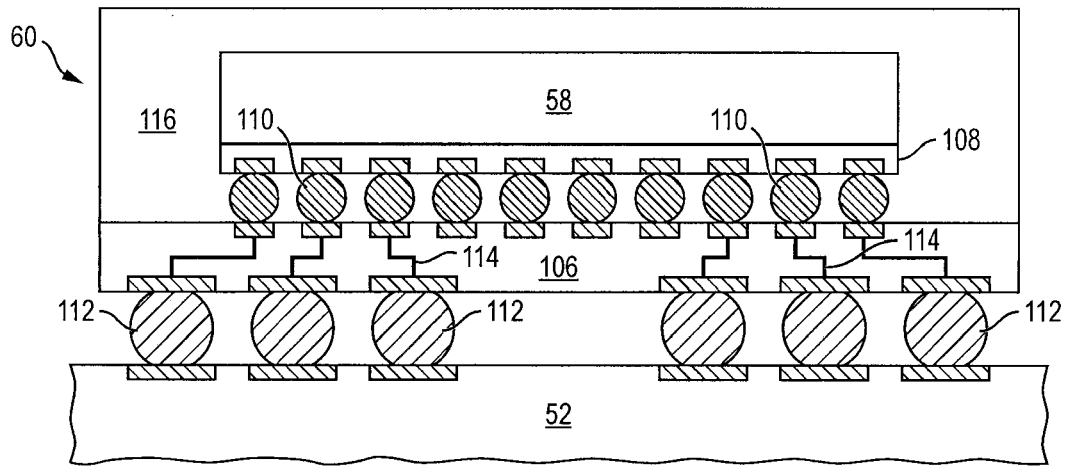

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon utectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
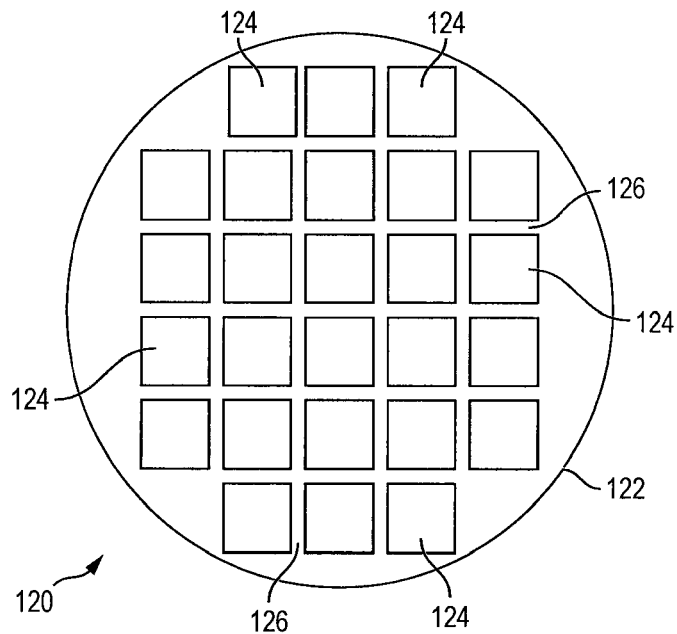
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

Figure 3B:
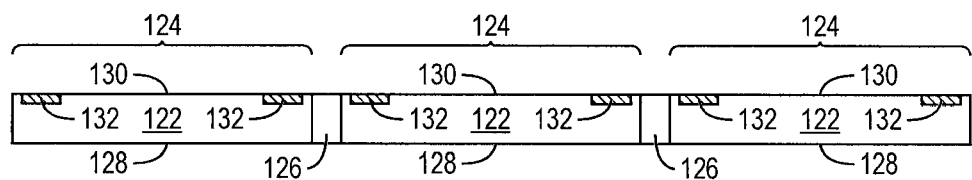

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
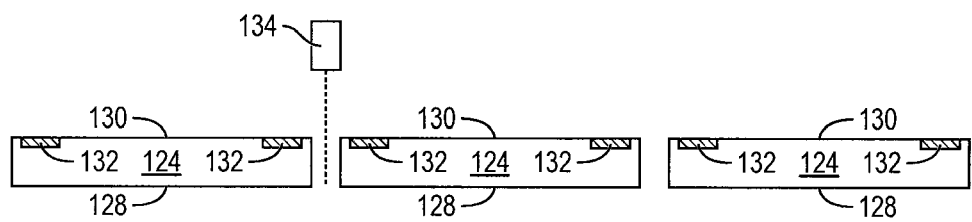

In FIG. 3c, semiconductor wafer 120 is singulated through saw street 126 using a saw blade or laser cutting tool 134 into individual semiconductor die 124.

Figure 4A:
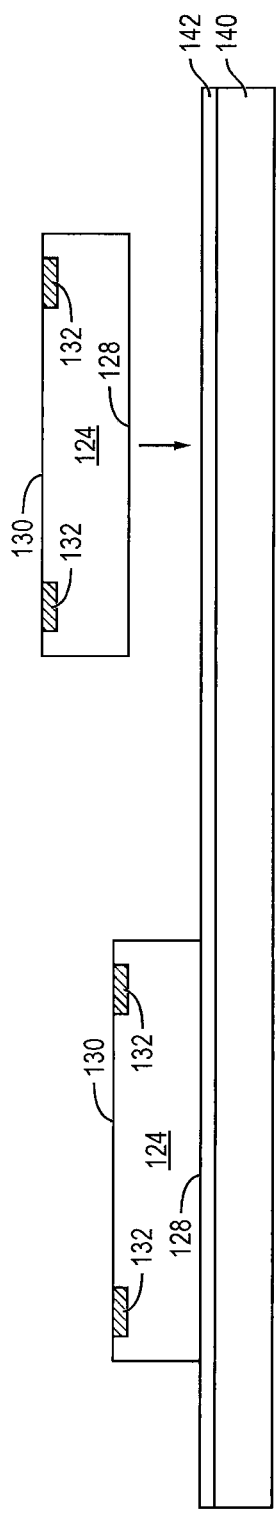

FIGS. 4a-4i illustrate, in relation to FIGS. 1 and 2a-2c, a process of forming conductive THVs and RDLs on opposite sides of a semiconductor die for RDL-to-RDL bonding. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
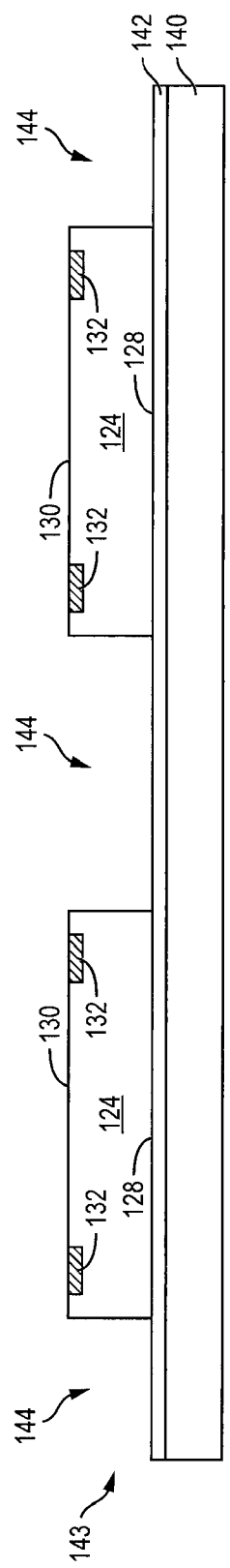

Semiconductor die 124 from FIGS. 3a-3c are positioned over and mounted to carrier 140 using a pick and place operation with back surface 128 oriented toward interface layer 142 and carrier 140. FIG. 4b shows semiconductor die 124 mounted to carrier 140 as reconfigured wafer 143. The reconfigured wafer 143 has sufficient separation between semiconductor die 124, shown as peripheral region 144, to form multiple rows of vias. Carrier 140 extends beyond the dimensions shown in FIG. 4b for a wafer-level multi-die attachment. Many semiconductor die 124 can be mounted to carrier 140.

In another embodiment, the unsingulated semiconductor wafer 120 from FIG. 3b is mounted to an expansion table. A saw blade or laser cutting tool cuts through saw street 126 down to the expansion table in a dicing operation. The expansion table moves in two-dimension lateral directions to create a greater physical separation between semiconductor die 124. The expansion table moves substantially the same distance in the x-axis and y-axis within the tolerance of the table control to provide separation around a periphery of each die. The peripheral region around the die has sufficient separation to form multiple rows of vias. For example, the post-expansion width of the peripheral region ranges from 5-200 μm.

Figure 4C:
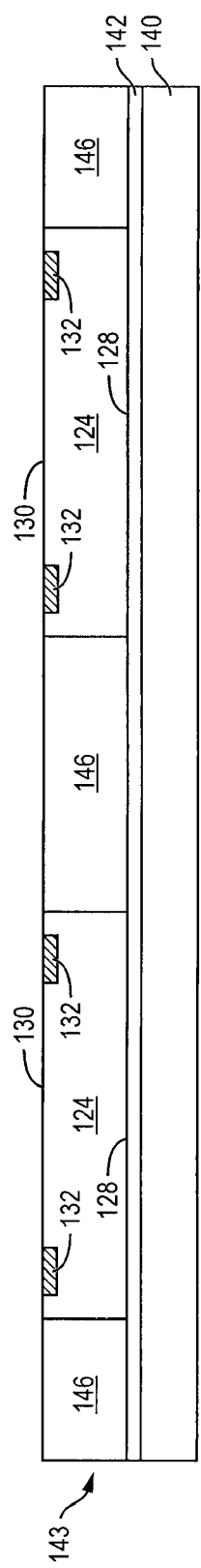

In FIG. 4c, an encapsulant or molding compound 146 is deposited over carrier 140 in the peripheral region 144 around semiconductor die 124 in using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Alternatively, encapsulant 146 is a compression molding compound, soft laminating film, or other material having dielectric or electrical insulating properties. Encapsulant 146 is non-conductive and environmentally protects the semiconductor device from external elements and contaminants.

In another embodiment, an organic material is deposited over carrier 140 and semiconductor die 124 by spin-coating or needle dispensing, or other suitable application process. The organic material can be benzocyclobutene (BCB), polyimide (PI), or acrylic resin. The organic material fills peripheral region 144 up to the top surface of active surface 130 of semiconductor die 124.

In FIG. 4d, a plurality of vias 148 is cut into encapsulant 146 or organic material around peripheral region 144 of semiconductor die 124 using a mechanical drill, laser drill, or etching process. Vias 148 can be formed as a single row or multiple rows with vertical or sloped sidewalls 150. FIG. 4e shows a top view of vias 148 cut into encapsulant 146 around peripheral region 144 of semiconductor die 124.

Figure 4F:
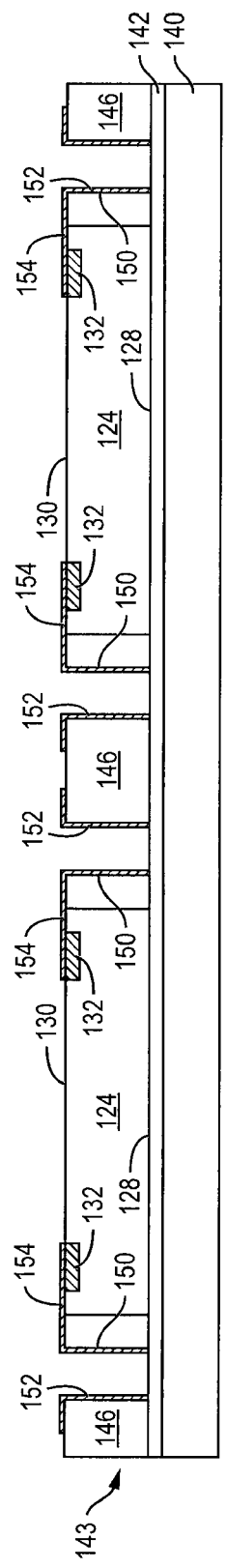

In FIG. 4f, an electrically conductive material is conformally deposited on sidewalls 150 of vias 148 using a deposition process such as CVD, PVD, printing, sputtering, electroplating, or electroless plating to form conductive through hole vias (THV) or conductive through organic vias (TOV) 152. The conductive material can be Al, Cu, Sn, Ni, Au, Ag, tungsten (W), or other suitable electrically conductive material. Conductive THVs 152 follow the contour of sidewalls 150 of vias 148 with a thickness of 3 micrometers (μm). An optional insulating or passivation layer can be formed over, back surface 128, active surface 130, and into vias 148 prior to metal deposition. The central portion of vias 148 remains devoid of electrically conductive material to enable faster deposition process and reduce void formation.

The electrically conductive material is also deposited on active surface 130 as redistribution layer (RDL) 154 during the same deposition process as forming conductive THVs 152, or a different deposition process. RDL 154 extends between conductive THVs 152 and contact pads 132 of semiconductor die 124 to provide electrical connection between the THVs and contact pads.

Figure 4G:
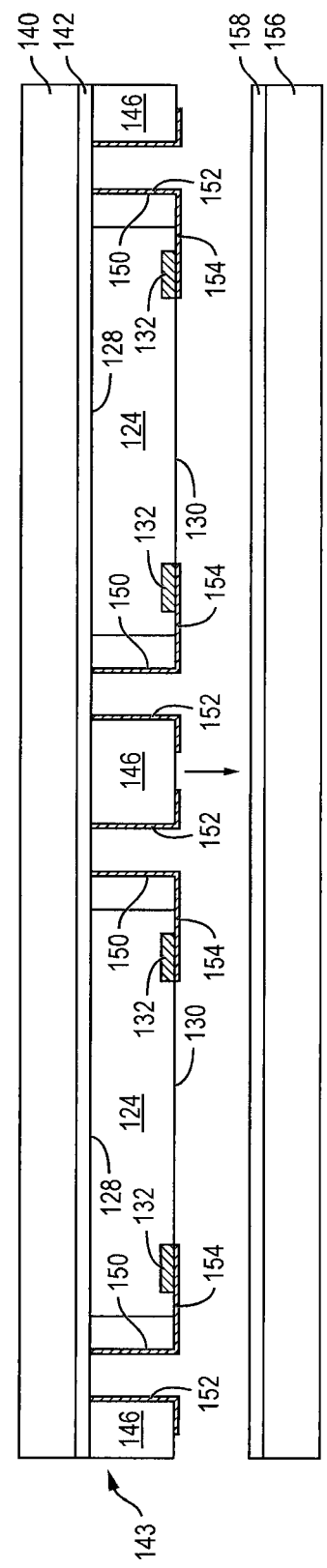

FIG. 4g shows a substrate or carrier 156 containing temporary or sacrificial base material such as silicon, polymer, beryllium oxide, or other suitable low-cost, rigid material for structural support. An interface layer or double-sided tape 158 is formed over carrier 156 as a temporary adhesive bonding film or etch-stop layer. The reconfigured wafer 143 is inverted and mounted to interface layer 158 and carrier 156 leading with active surface 130 of semiconductor die 124.

In FIG. 4h, carrier 140 and interface layer 142 are removed by chemical etching, mechanical peeling, chemical mechanical polish (CMP), mechanical grinding, thermal bake, UV light, laser scanning, or wet stripping to expose back surface 128 of semiconductor die 124. In one embodiment, vias 148 are cut completely through encapsulant 146 as in FIG. 4d. Accordingly, removing carrier 140 exposes conductive THVs 152. Alternatively, vias 146 are cut partially through encapsulant 146 as in FIG. 4d, followed by backgrinding in FIG. 4h to expose conductive THVs 152.

An electrically conductive layer or RDL 160 is formed over back surface 128 of semiconductor die 124 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive THVs 152.

In FIG. 4i, reconfigured wafer 143 is singulated through encapsulant 146 using saw blade or laser cutting tool 162. Carrier 156 and interface layer 158 are removed by chemical etching, mechanical peeling, CMP, mechanical grinding, thermal bake, UV light, laser scanning, or wet stripping to separate the individual semiconductor die 124.

Figure 5A:
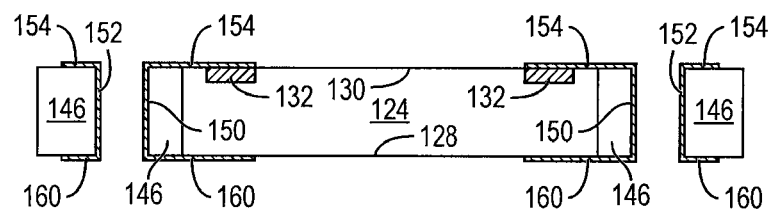
FIGS. 5a-5b illustrate the semiconductor die with conductive THVs and RDLs on opposite sides of a semiconductor die for RDL-to-RDL bonding.
Figure 5B:
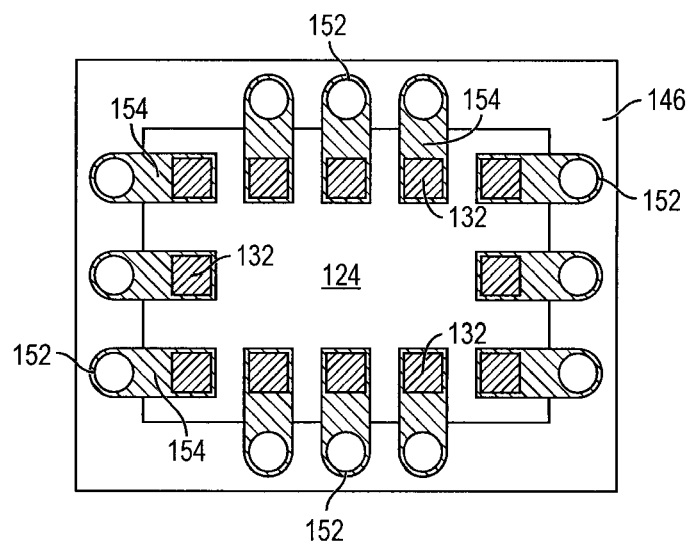

FIG. 5a shows a cross-sectional view of semiconductor die 124 after singulation. The conformal conductive THVs 152 electrically connect contact pads 132 and RDL 154 on active surface 130 of semiconductor die 124 to RDL 160 on back surface 128. FIG. 5b shows a top view of semiconductor die 124 with contact pads 132 electrically connected to RDL 154 and conductive THVs 152.

Figure 6:
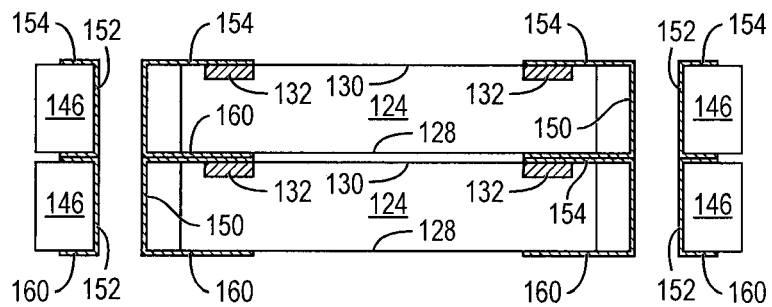
FIG. 6 illustrates stacked semiconductor die electrically interconnected with RDL-to-RDL bonding.

In FIG. 6, two semiconductor die 124 are stacked by direct metal-to-metal bonding, such as hot stamping or thermo-compression bonding. Contact pads 132 of the upper semiconductor die are electrically connected to contact pads 132 of the lower semiconductor die by way of RDL 154 and 160 and conductive THVs 152. The contact area between RDL 154 and 160 is relatively large for increased joint strength and greater reliability. The direct metal-to-metal bonding avoids the need for interconnect bumps and lowers electrical resistance. The direct metal-to-metal bonding is also applicable to wafer-to-wafer, chip-to-wafer, and chip-to-chip stacking.

Figure 7:
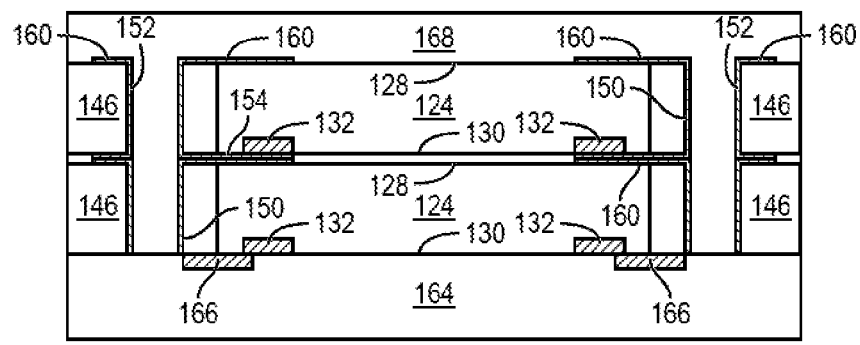
FIG. 7 illustrates the stacked semiconductor die mounted to a substrate.

In FIG. 7, the stacked semiconductor die 124 are mounted to PCB or substrate 164. RDL 160 of the lower semiconductor die 124 is electrically connected to bond pads or conductive traces 166 on substrate 164. An encapsulant or molding compound 168 is deposited over semiconductor die 124 and substrate 164 in using a paste printing, compressive molding, transfer molding, liquid encapsulant molding, vacuum lamination, spin coating, or other suitable applicator. Encapsulant 168 can be polymer composite material, such as epoxy resin with filler, epoxy acrylate with filler, or polymer with proper filler. Encapsulant 168 is non-conductive and environmentally protects the semiconductor device from external elements and contaminants.

Figure 8A:
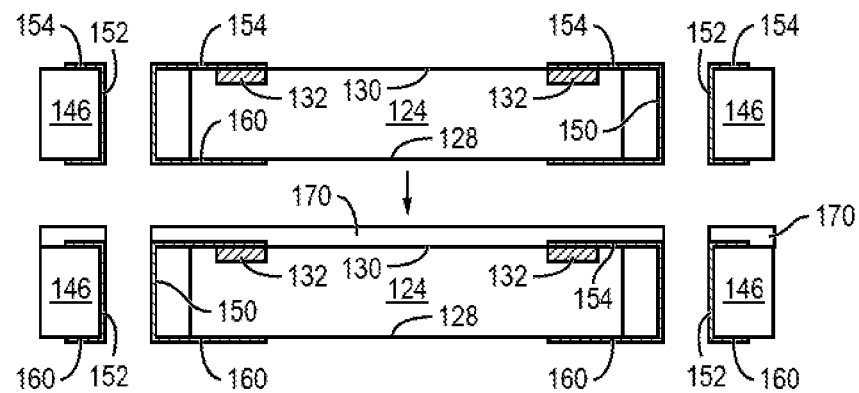
FIGS. 8a-8b illustrate NUF disposed between the stacked semiconductor die.

FIG. 8a shows an embodiment, similar to FIG. 6, with no-flow underfill material (NUF) 170 disposed between two semiconductor die 124 prior to stacking. Note that NUF 170 typically does not cover vias 148. The two semiconductor die 124 are stacked by direct metal-to-metal bonding, such as hot stamping or thermo-compression bonding. Contact pads 132 of the upper semiconductor die are electrically connected to contact pads 132 of the lower semiconductor die by way of RDL 154 and 160 and conductive THVs 152. The contact area between RDL 154 and 160 is relatively large for increased joint strength and greater reliability. The direct metal-to-metal bonding avoids the need for interconnect bumps and lowers electrical resistance.

Figure 8B:
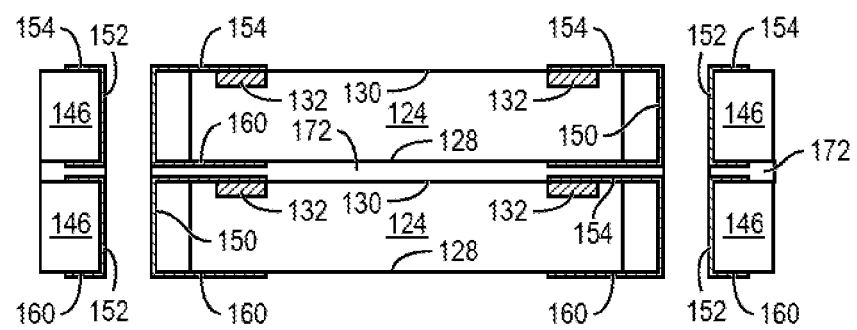

In FIG. 8b, an anisotropic conductive film (ACF), anisotropic conductive paste (ACP), or anisotropic conductive adhesive (ACA) 172 is deposited between semiconductor die 124 using lamination, printing, or other suitable application process. ACF 172 can be epoxy or acryl-based material with B-stage properties. In one embodiment, ACF 172 contains metal particles or matrix of conductive particles, each having a polymer core with Ni plating and Au plating and outer polymer coating. In its normal state, ACF 172 is non-conductive as the conductive particles are not in electrical contact with adjacent conductive particles. However, under proper conditions of force and temperature, certain portions of ACF 172 can be made conductive as the particles are forced together to form an electrical connection. RDL 154 and 160 will not form direct connection, but it will be connected via particles within ACF 172.

Figure 9:
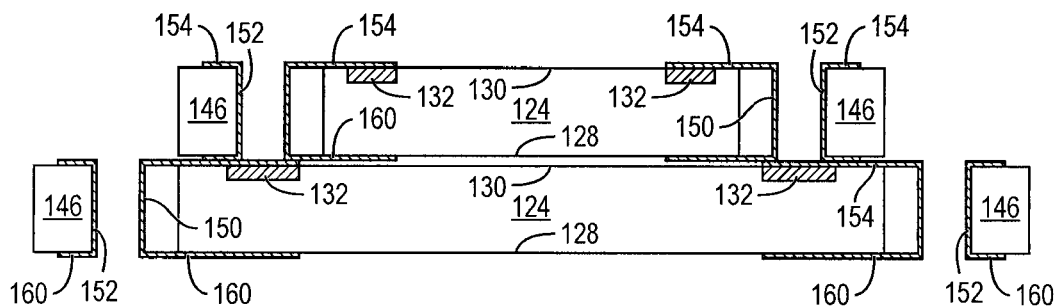
FIG. 9 illustrates different size stacked semiconductor die electrically interconnected with RDL-to-RDL bonding.

FIG. 9 shows an embodiment, similar to FIG. 6, with different size semiconductor die 124. The two dissimilar semiconductor die 124 are stacked by direct metal-to-metal bonding, such as hot stamping or thermo-compression bonding. Contact pads 132 of the upper semiconductor die are electrically connected to contact pads 132 of the lower semiconductor die by way of RDL 154 and 160 and conductive THVs 152. The contact area between RDL 154 and 160 is relatively large for increased joint strength and greater reliability. The direct metal-to-metal bonding avoids the need for interconnect bumps and lowers electrical resistance.

Figure 10A:
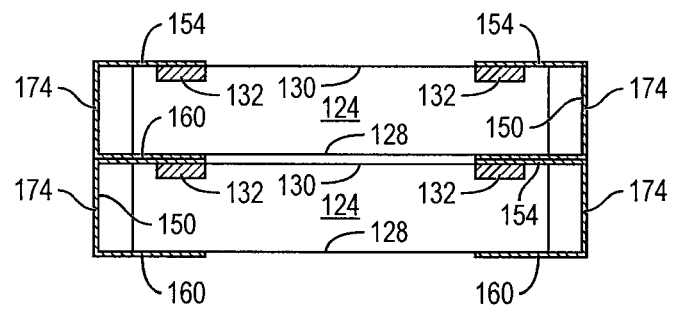
FIGS. 10a-10b illustrates the semiconductor die with opposing RDLs and half conductive THVs for RDL-to-RDL bonding.
Figure 10B:
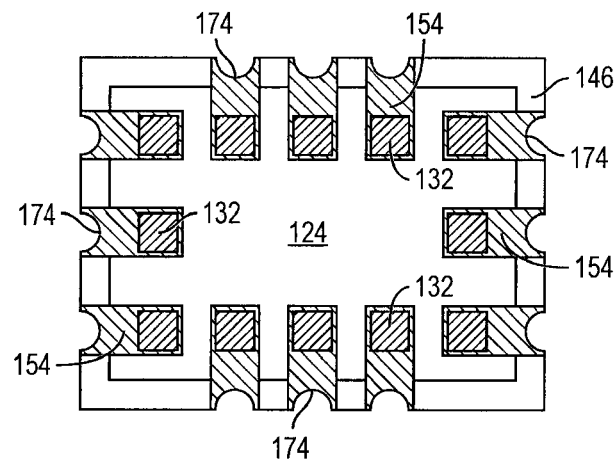

FIGS. 10a-10b show an embodiment, similar to FIG. 6, with half conductive THVs 174. The half conductive THVs 174 are formed by singulating reconfigured wafer 143 through the THVs in FIG. 4i. The two semiconductor die 124 are stacked by direct metal-to-metal bonding, such as hot stamping or thermo-compression bonding. Contact pads 132 of the upper semiconductor die are electrically connected to contact pads 132 of the lower semiconductor die by way of RDL 154 and 160 and conductive THVs 174. The contact area between RDL 154 and 160 is relatively large for increased joint strength and greater reliability. The direct metal-to-metal bonding avoids the need for interconnect bumps and lowers electrical resistance. FIG. 10b shows a top view of semiconductor die 124 with half conductive THVs 174.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first carrier;
disposing a plurality of semiconductor die over the first carrier;
depositing a first encapsulant over the first carrier around a peripheral region of the plurality of semiconductor die;
forming a plurality of vias through the first encapsulant;
conformally applying a first conductive layer over a sidewall of the vias to form conductive vias with a surface of the conductive vias exposed to an interior of the vias following a contour of the sidewall of the vias;
forming a second conductive layer directly on the first encapsulant and a first surface of the plurality of semiconductor die between the conductive vias and contact pads of the plurality of semiconductor die;
providing a second carrier;
disposing a second surface of the plurality of semiconductor die opposite the first surface of the plurality of semiconductor die over the second carrier;

removing the first carrier;
forming a third conductive layer directly on the second surface of the plurality of semiconductor die and first encapsulant, the second and third conductive layers being electrically connected to the conductive vias; and
removing the second carrier.

2. The method of claim 1, further including forming the first conductive layer and the second conductive layer during the same manufacturing process.

3. The method of claim 1, further including singulating the plurality of semiconductor die through the conductive vias to form half conductive vias.

4. The method of claim 1, further including:
stacking the plurality of semiconductor die; and
electrically connecting the plurality of semiconductor die through the conductive vias and the second and third conductive layers.

5. The method of claim 4, further including:
mounting the plurality of semiconductor die to a substrate; and
depositing a second encapsulant over the plurality of semiconductor die and the substrate.

6. The method of claim 1, further including:
disposing a no flow underfill material between a first and second semiconductor die; and
stacking the first and second semiconductor die.

7. A method of making a semiconductor device, comprising:
providing a first carrier;
disposing a plurality of semiconductor die over the first carrier;
depositing a first encapsulant over the first carrier around a peripheral region of the semiconductor die;
forming a plurality of vias through the first encapsulant;
conformally applying a first conductive layer over a sidewall of the vias to form conductive vias with a central portion of the conductive vias devoid of electrically conductive material;
forming a second conductive layer over the first encapsulant and a first surface of the plurality of semiconductor die between the conductive vias and contact pads of the plurality of semiconductor die;
providing a second carrier;
disposing a second surface of the semiconductor die opposite the first surface of the semiconductor die over the second carrier;
removing the first carrier;
forming a third conductive layer over the second surface of the plurality of semiconductor die and first encapsulant, the second and third conductive layers being electrically connected to the conductive vias; and
removing the second carrier.

8. The method of claim 7, further including forming the first conductive layer and the second conductive layer during the same manufacturing process.

9. The method of claim 7, further including:
stacking the plurality of semiconductor die; and
electrically connecting the plurality of semiconductor die through the conductive vias and the second and third conductive layers.

10. The method of claim 9, further including:
mounting the plurality of semiconductor die to a substrate; and
depositing a second encapsulant over the plurality of semiconductor die and substrate.

11. The method of claim 7, further including:
stacking a plurality of different size semiconductor die; and
electrically connecting the plurality of different size semiconductor die through the conductive vias and the second and third conductive layers.

12. The method of claim 7, further including:
disposing an insulating material between a first and second semiconductor die; and
stacking the first and second semiconductor die.

13. The method of claim 7, further including singulating the plurality of semiconductor die through the conductive vias to form half conductive vias.

14. A method of making a semiconductor device, comprising:
depositing a first encapsulant around a peripheral region of a semiconductor die;
forming a conductive via through the first encapsulant with a central portion of the conductive via devoid of electrically conductive material;
forming a first conductive layer over the first encapsulant and a first surface of the semiconductor die between the conductive via and a contact pad of the semiconductor die;
providing a carrier;
disposing a second surface of the semiconductor die opposite the first surface of the semiconductor die over the carrier;
forming a second conductive layer over the second surface of the semiconductor die and first encapsulant, the first and second conductive layers being electrically connected to the conductive via; and
removing the carrier.

15. The method of claim 14, further including forming the conductive via and the first conductive layer during the same manufacturing process.

16. The method of claim 14, further including:
stacking a plurality of semiconductor die; and
electrically connecting the plurality of semiconductor die through the conductive via and the first and second conductive layers.

17. The method of claim 16, further including:
mounting the plurality of semiconductor die to a substrate; and
depositing a second encapsulant over the plurality of semiconductor die and the substrate.

18. The method of claim 14, further including:
stacking a plurality of different size semiconductor die; and
electrically connecting the plurality of different size semiconductor die through the conductive via and the first and second conductive layers.

19. The method of claim 14, further including:
disposing an insulating material between a first and second semiconductor die; and
stacking the first and second semiconductor die.

20. A method of making a semiconductor device, comprising:
depositing a first encapsulant around a peripheral region of a semiconductor die;
forming a conductive via through the first encapsulant with a central portion of the conductive via devoid of electrically conductive material;
forming a first conductive layer directly on the first encapsulant and a first surface of the semiconductor die between the conductive via and a contact pad of the semiconductor die; and forming a second conductive layer directly on the first encapsulant and a second surface of the semiconductor die opposite the first surface of the semiconductor die, the second conductive layer being electrically connected to the conductive via.

21. The method of claim 20, further including forming the conductive via and the first conductive layer during the same manufacturing process.

22. The method of claim 20, further including:
stacking a plurality of semiconductor die; and
electrically connecting the plurality of semiconductor die through the conductive via and the first and second conductive layers.

23. The method of claim 22, further including:
disposing the plurality of semiconductor die over a substrate; and
depositing a second encapsulant over the plurality of semiconductor die and the substrate.

24. The method of claim 20, further including:
stacking a plurality of different size semiconductor die; and
electrically connecting the plurality of different size semiconductor die through the conductive via and the first and second conductive layers.

25. The method of claim 20, further including:
disposing an insulating material between a first and second semiconductor die; and
stacking the first and second semiconductor die.

* * * * *